US007038954B2

(12) United States Patent
Jung

(10) Patent No.: US 7,038,954 B2
(45) Date of Patent: May 2, 2006

(54) APPARATUS WITH EQUALIZING VOLTAGE GENERATION CIRCUIT AND METHODS OF USE

(75) Inventor: Chulmin Jung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 10/929,202

(22) Filed: Aug. 30, 2004

(65) Prior Publication Data
US 2006/0044930 A1   Mar. 2, 2006

(51) Int. Cl.
*G11C 11/00* (2006.01)

(52) U.S. Cl. ............................ 365/189.07; 365/189.09; 365/203; 365/204; 327/536; 327/77; 327/54

(58) Field of Classification Search ........... 365/189.07, 365/203, 204, 189.09, 210; 327/536, 77, 327/54
See application file for complete search history.

(56) References Cited

U.S. PATENT DOCUMENTS

| 5,991,904 | A | 11/1999 | Duesman |
| 6,115,319 | A * | 9/2000 | Kinoshita et al. ............ 365/233 |
| 6,172,935 | B1 | 1/2001 | Wright et al. |
| 6,212,111 | B1 | 4/2001 | Wright et al. |
| 6,215,709 | B1 | 4/2001 | Wright et al. |
| 6,249,459 | B1 * | 6/2001 | Chen et al. ............. 365/185.26 |
| 6,285,622 | B1 * | 9/2001 | Haraguchi et al. .......... 365/226 |
| 6,335,893 | B1 * | 1/2002 | Tanaka et al. .............. 365/226 |
| 6,351,404 | B1 | 2/2002 | Wright et al. |
| 6,353,556 | B1 * | 3/2002 | Chen et al. ............. 365/185.26 |
| 6,373,752 | B1 | 4/2002 | Wright et al. |
| 6,411,157 | B1 * | 6/2002 | Hsu et al. .................... 327/536 |
| 6,512,711 | B1 | 1/2003 | Wright et al. |
| 6,535,435 | B1 * | 3/2003 | Tanaka et al. ......... 365/189.09 |
| 6,614,270 | B1 * | 9/2003 | Okamoto et al. ............. 327/77 |
| 6,628,554 | B1 * | 9/2003 | Hidaka ................... 365/189.09 |
| 6,661,729 | B1 * | 12/2003 | Yamasaki .................... 365/226 |
| 6,665,222 | B1 | 12/2003 | Wright et al. |
| 6,791,894 | B1 * | 9/2004 | Nagai et al. ................. 365/226 |
| 2002/0041531 | A1 * | 4/2002 | Tanaka et al. .............. 365/205 |
| 2003/0151967 | A1 * | 8/2003 | Nagai et al. ................. 365/226 |

FOREIGN PATENT DOCUMENTS

JP          000405523 A2 *  1/1991
JP      02002290232 A   * 10/2002

* cited by examiner

*Primary Examiner*—Viet Q. Nguyen
(74) *Attorney, Agent, or Firm*—Schwegman, Lundberg, Woessner & Kluth, P.A.

(57) ABSTRACT

A memory device includes an equalization voltage generator. The equalization voltage generator includes an oscillator and a charge pump to produce a first voltage, which may be used as an equalization voltage for pairs of complementary digit lines. The oscillator is controlled by an oscillator control signal, which is produced by a feedback and control loop of the equalization voltage generator. The feedback and control loop includes a reference generator circuit to produce a stable, internal reference signal that is clamped at a maximum reference voltage. A comparator of the feedback and control loop compares the internal reference signal with a second voltage, which is proportional to the first voltage. The comparator causes the oscillator to turn on when the second voltage is lower than the reference voltage, and causes the oscillator to turn off when the second voltage is higher than the reference voltage.

31 Claims, 8 Drawing Sheets

APPARATUS WITH EQUALIZING VOLTAGE GENERATION CIRCUIT AND METHODS OF USE

TECHNICAL FIELD

The present invention relates generally to memories, and more specifically to apparatus and methods for equalizing voltages between digit line pairs within a memory device.

BACKGROUND

A dynamic random access memory (DRAM) device includes a memory cell array. The memory cell array includes a number of memory cells, which are arranged in rows and columns. One memory cell is positioned at the intersection of each row and column. Each row of memory cells has an associated row line, ROW, and each column of memory cells has an associated pair of complementary digit lines, DIGIT and DIGIT_.

At certain times (e.g., prior to a READ operation), it is desirable to equalize the voltages present on the complementary digit lines. Accordingly, the memory cell array includes an equalization circuit coupled between each pair of complementary digit lines, which operates to equalize the voltage on the associated pair of complementary digit lines.

In current DRAMs, each pair of complementary digit lines is equalized using an equalization voltage, referred to as VCCP. VCCP has a voltage level that is based on an externally-supplied power supply voltage, VCC. For example, VCCP may be approximately equal to VCC plus a set voltage margin. According to some standards, VCCP=VCC+1.2 Volts (V).

VCC is prone to fluctuations. Accordingly, VCCP also is prone to fluctuations. VCCP is boosted higher than VCC to provide more robust circuit operation in light of the VCC fluctuations. Due in part to the power constraints, current DRAMs include NMOS gates to produce VCCP. NMOS-based designs often result in relatively large layout sizes, and accordingly relatively larger device sizes.

DETAILED DESCRIPTION

Figure 1:
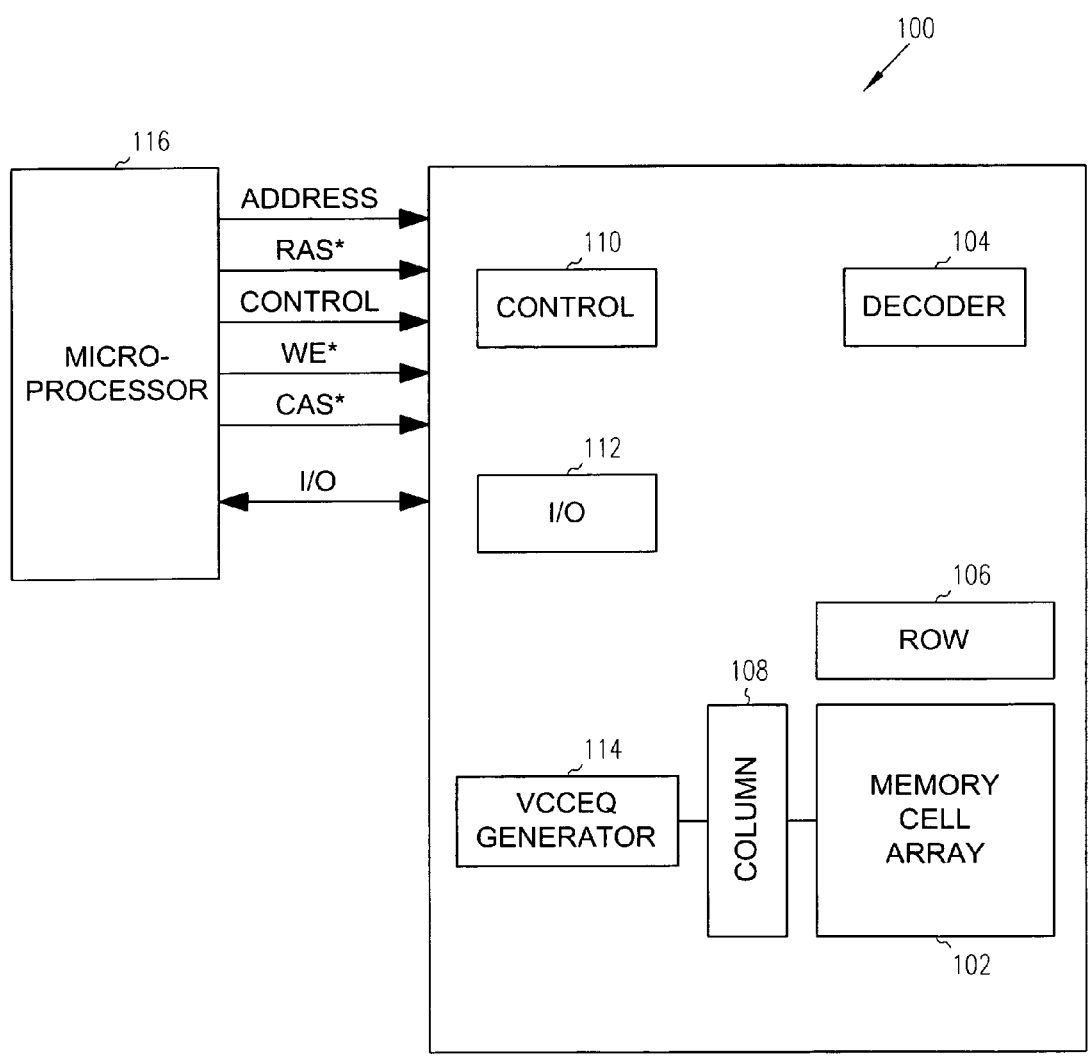
FIG. 1 illustrates a simplified block diagram of a dynamic random access memory device, in accordance with an embodiment.

FIG. 1 is a schematic block diagram of a dynamic random access memory (DRAM) device 100, in accordance with an embodiment. DRAM 100 is used to store data which is accessed via input/output (I/O) lines. For context purposes, DRAM 100 is shown to be coupled to an external microprocessor 116 for memory accessing. In alternate configurations, DRAM 100 may be coupled with additional or different types of devices (e.g., a memory controller or other device).

In an embodiment, DRAM 100 receives control signals from microprocessor 116, such as WE*, RAS* and CAS* signals. It will be appreciated by those skilled in the art, based on the description herein, that additional circuitry and control signals can be provided, and that the DRAM of FIG. 1 has been simplified to help focus on the inventive subject matter.

DRAM 100 includes one or more arrays of memory cells 102, address decoder 104, row access circuitry 106, column access circuitry 108, control circuitry 110, and I/O circuitry 112. In addition, in an embodiment, DRAM 100 includes one or more equalizing voltage generator circuits 114 ("VCCEQ generator"), operatively coupled to the column access circuitry 108.

Memory cell array 102 includes a number of memory cells arranged in n rows and m columns. One memory cell is positioned at the intersection of each row and column. Each memory cell includes an access switch in the form of a transistor (e.g., a field effect transistor) and a storage element in the form of a capacitor. Binary data is stored in a memory cell as a voltage across the capacitor. A voltage of approximately VCC at a first plate of the capacitor corresponds to a first binary data value, which is typically a 1. Conversely, a voltage of approximately 0 at the first plate corresponds to a second binary data value, which is typically a 0.

Each row of memory cells has an associated row line, ROW, and each column of memory cells has an associated pair of complementary digit lines, DIGIT and DIGIT_. Each memory cell in a given row of memory cells has a control terminal in the form of the gate of the transistor coupled to the associated row line, ROW. Each memory cell in a given column of memory cells has a data terminal in the form of the source terminal of the transistor coupled to one of the associated complementary digit lines, DIGIT and DIGIT_. Although a memory cell array 102 is described as including complementary digit lines DIGIT and DIGIT_, one skilled in the art will appreciate, based on the description herein, that the inventive subject matter is applicable to other memory structures and not limited to this specific memory structure.

The memory cell array 102 includes an equalization circuit coupled between each pair of complementary digit lines, DIGIT and DIGIT_. An equalization circuit operates to equalize the voltage on its associated pair of complementary digit lines. In an embodiment, each equalization circuit includes an equalization transistor and a precharge circuit. The equalization transistor has its drain and source terminals coupled between the complementary digit lines DIGIT and DIGIT_and its gate terminal coupled to an equalization line.

In an embodiment, the precharge circuit includes a pair of transistors, with the drain terminals of these transistors connected to the complementary digit lines, DIGIT and DIGIT_, respectively. The source terminals of the transistors are connected to an "equalization voltage" approximately equal to VCC/2. VCCEQ generator 114 generates this equalization voltage, in an embodiment, and the equalization voltage is referred to herein as "VCCEQ." The gates of the transistors are coupled to the equalization line.

In operation, an equalization circuit equalizes the voltage on its complementary digit lines, DIGIT and DIGIT_, to approximately the equalization voltage. To activate the equalization circuit, the equalization line is driven with an voltage approximately equal to VCC. In response to this voltage on the equalization line, the equalization and precharge circuit transistors are turned ON. The precharge circuit transistors drive the complementary digit lines DIGIT and DIGIT_to voltage levels approximately equal to VCCEQ, and the equalization transistor assures that both the complementary digit lines are at the same voltage level. After the complementary digit lines, DIGIT and DIGIT_, are equalized to approximately VCCEQ, the equalization line EQ is driven to approximately 0 V to turn OFF the equalization and precharge circuit transistors.

Figure 2:
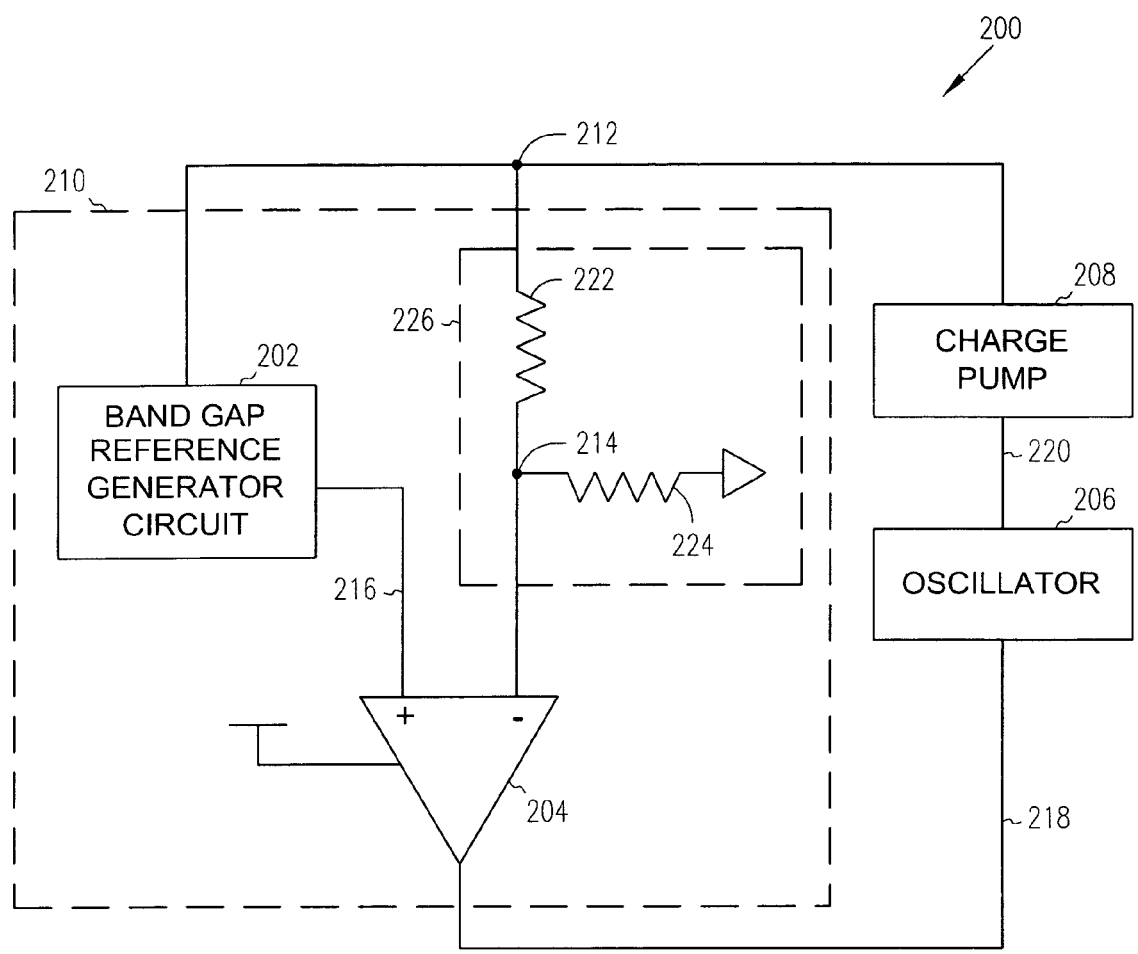
FIG. 2 illustrates a simplified block diagram of an equalizing voltage generator circuit, in accordance with an embodiment.

FIG. 2 illustrates a simplified block diagram of an equalizing voltage generator circuit 200 (e.g., VCCEQ generator 114, FIG. 1), in accordance with an embodiment. Circuit 200 includes a feedback and control circuit 210, an oscillator 206, and a charge pump 208, in an embodiment. The feedback and control circuit 210 includes a reference generator circuit 202 (e.g., a band gap reference generator), a comparator 204, and a voltage divider circuit 226, in an embodiment.

Circuit 200 operates basically as follows. Oscillator 206 receives an oscillator control signal 218 from feedback and control circuit 210. Oscillator 206, in turn, produces an oscillator signal 220 based on the oscillator control signal 218. Charge pump 208 receives the oscillator signal 220 and produces a first voltage at a first node 212, where the first voltage is affected by the oscillator signal 220. Feedback and control circuit 210 produces an internal reference voltage 216 (e.g., a band gap reference voltage) and produces the oscillator control signal 218 based on the internal reference voltage 216 and the first voltage. Production of the internal reference voltage 216 and production of the oscillator control signal 218 are described in more detail below.

The first voltage, which is carried by a first node 212 of circuit 200, is referred to as a "first node voltage" or "$V_{212}$." In an embodiment, the first node voltage is an equalizing voltage, VCCEQ, for digit line pairs within a DRAM device. In other embodiments, the first node voltage may be used for other purposes. Although the first node voltage may be referred to below as VCCEQ, this example is not meant to be limiting.

As mentioned previously, the first node voltage, at node 212, is produced by charge pump 208. A main purpose of charge pump 208 is to produce a voltage that may be higher than an external voltage, VCCX. For example, charge pump 208 may be capable of producing an output voltage at node 212 that exceeds 1.5 V, even though the circuit may be supplied with an external voltage, VCCX, of 1.0 V or less. As the below description will indicate, circuit 200 is able to produce a stable VCCEQ that is higher than the external voltage. Accordingly, the circuit may consume less power than other circuits.

Charge pump 208 produces the first node voltage in response an oscillator signal 220, which charge pump 208 receives from oscillator 206. When oscillator 206 is on (i.e., it is producing oscillator signal 220), the voltage produced by charge pump 208 increases. Accordingly, in an embodiment, VCCEQ increases. When oscillator 206 is off, the voltage at node 212 decreases. In an embodiment, the voltage decrease occurs at least in part due to a current flow through divider circuit 226. The voltage may decrease due to current flow through other portions of the circuitry (not shown) as well (e.g., when VCCEQ is used to equalize DIGIT and DIGIT_.

Oscillator 206 is turned on and off in response to the oscillator control signal 218, which is provided by comparator 204. In an embodiment, comparator 204 includes an operational amplifier. Comparator 204 produces the oscillator control signal 218 in response to a comparison between a reference voltage 216 and a second node voltage present at a second node 214 of circuit 200. The voltage present at second node 214 is referred to as a "second node voltage" or "$V_{214}$."

In an embodiment, the second node voltage is a fraction of the first node voltage (i.e., the voltage present at first node 212). The relative values of the first node voltage and the second node voltage are primarily affected by the ratio between the voltage divider circuit's resistors 222, 224 (referred to respectively as R1 and R2), in an embodiment, as follows:

$$V_{212} = V_{214}\left(1 + \frac{R_1}{R_2}\right) \qquad \text{Equ. 1}$$

For example, but not by way of limitation, $V_{214}$ may be used as an equalization voltage, VCCEQ, for a memory cell array. When in steady state, it may be desired to maintain VCCEQ at a pre-defined level, regardless of the value of VCC. For example, even if VCC is <<1 V, it may be desired to maintain VCCEQ at a pumped up value of approximately 1.5 V. According to Equ. 1, above, and assuming that $R_2=4\times R_1$, then $V_{214}$ approximately equals $0.8\times V_{212}$. Accordingly, if $V_{212}$=VCCEQ~1.5 V, then $V_{214}$~1.2 V, which is the same as the reference voltage level at node 216 (e.g., the band gap reference voltage).

Circuit 200 may have the effect of immunizing $V_{212}$ (e.g., VCCEQ) from fluctuations in the supply voltage, VCC. In an embodiment, this is achieved by comparing $V_{214}$ (which is directly affected by $V_{212}$) with a steady reference voltage 216, which is produced by reference generator circuit 202. In an embodiment, reference generator circuit 202 is a band gap reference (BGR) circuit or a voltage clamping circuit.

Reference generator circuit 202 receives $V_{212}$, and produces an output voltage 216 that tracks $V_{212}$, but which is clamped at a "maximum reference voltage." For example, in an embodiment, the circuit 202 may be designed to produce a maximum reference voltage equal to $V_{214}$ (e.g., 1.2 V) when $V_{212}$ has reached the target VCCEQ (e.g., 1.5 V). Accordingly, the maximum reference voltage may approximately equal 1.2 V, in the given example.

Figure 3:
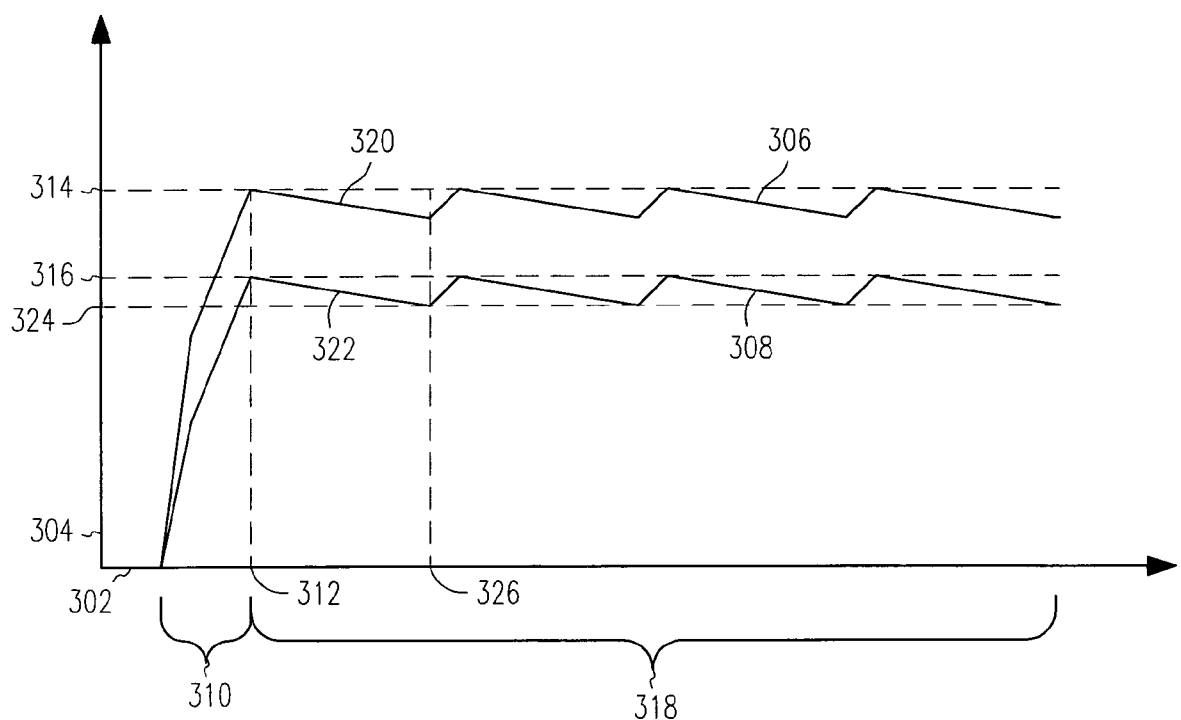
FIG. 3 is a graph illustrating an example of relative voltage levels within an equalizing voltage generator circuit, in accordance with an embodiment.

FIG. 3 is a graph illustrating an example of relative voltage levels within an equalizing voltage generator circuit, in accordance with an embodiment. FIG. 3 may be best understood by simultaneously referring to the circuit of FIG. 2, as well. The graph of FIG. 3 represents an example of relative $V_{212}$ and $V_{214}$ voltage levels (indicated along voltage axis 304) over time (indicated along time axis 302). $V_{212}$ is represented by graph line 306 and $V_{214}$ is represented by graph line 308.

Initially, the circuit is off. During a power up time 310, the oscillator 206 is turned on, and thus charge pump 208 begins to ramp up $V_{212}$ 306. Simultaneously, $V_{214}$ 308 also ramps up in proportion to $V_{212}$ 306. When comparator 204 determines that $V_{214}$ 308 approximately equals the maximum reference voltage 316 (i.e., by comparing the voltage at node 214 with the voltage at input 216), comparator 204 indicates that $V_{212}$ 306 has reached the target voltage 314 (e.g., target VCCEQ). Accordingly, at time 312, when $V_{212}$ approximately equals target voltage 314, and $V_{214}$ 308 approximately equals the maximum reference voltage 316, comparator 204 provides an oscillator control signal 218 to turn off oscillator 206.

As mentioned previously, after oscillator 206 turns off, $V_{212}$ 306 will begin to decrease, as indicated by segment 320 of $V_{212}$ 306. As $V_{212}$ 306 decreases, $V_{214}$ 308 also decreases, as indicated by segment 322 of $V_{214}$ 308. Eventually, $V_{214}$ 308 will reach a voltage 324, which causes comparator 204 to determine that $V_{212}$ is sufficiently less than the maximum reference voltage 316. At that time 326, comparator 204 will provide an oscillator control signal 218 to turn oscillator 206 back on. This will cause charge pump 208 to again increase $V_{212}$ 306, and thus $V_{214}$ 308. When $V_{214}$ 308 again approximately equals the maximum reference voltage 316, comparator 204 will cause oscillator 206 to turn off. This on-off oscillator cycling will continue (e.g., throughout period 318 and thereafter) until the circuit is powered down.

As the previous paragraph indicates, a certain amount of hysterisis exists in the oscillator control loop. In other words, during steady-state operations, $V_{212}$ 306 and $V_{214}$ 308 vary within relatively small voltage ranges that are proximate to the target output voltage 314 and the maximum reference voltage 316, respectively. In an embodiment, the voltage range for the target output voltage is 0.9% VCCEQ–1.1% VCCEQ. The range for the maximum reference voltage is proportionally less than the range for the target output voltage. In various embodiments, the voltage ranges may be wider or narrower than the above-given range. In addition, in various embodiments, these voltage ranges may exist above, below, or surrounding the target output voltage 314 and the maximum reference voltage 316.

Although relatively small output voltage fluctuations exist within the above ranges, these fluctuations are not affected by the less predictable fluctuations that may exist with the external supply voltage, VCCX. Accordingly, using embodiments of the inventive subject matter, a process/voltage/temperature ("PVT") invariant VCCEQ may be generated regardless of more PVT affected VCCX fluctuations. Further, using embodiments of the inventive subject matter, circuits may be designed without the thick NMOS processes. Layout sizes may thus be reduced.

Figure 4:
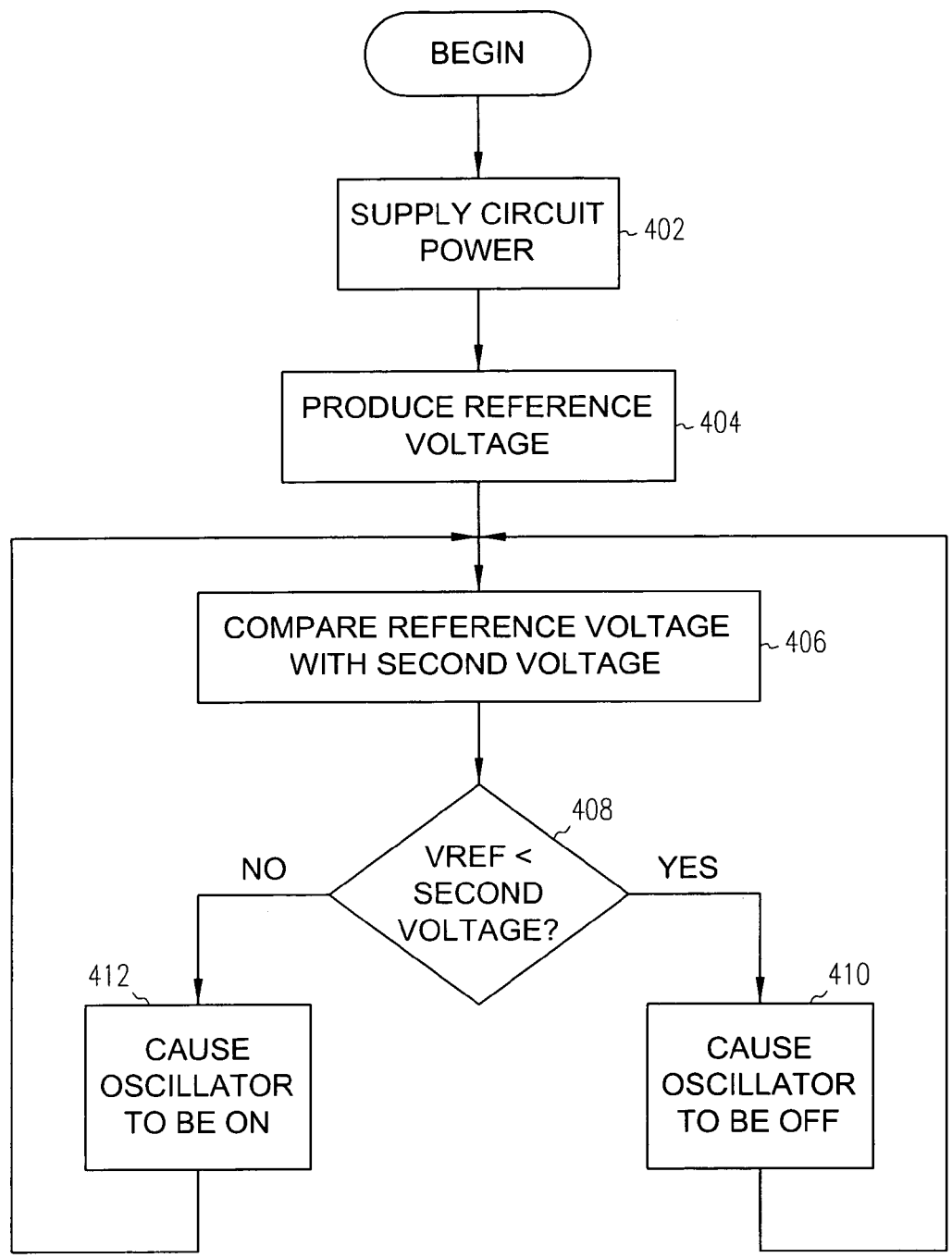
FIG. 4 illustrates a flowchart of a method for generating an equalizing voltage, in accordance with an embodiment.

FIG. 4 illustrates a flowchart of a method for generating an equalizing voltage, in accordance with an embodiment. The method begins, in block 402, when power is initially supplied to an equalizing voltage generator circuit (e.g., VCCEQ generator 114, FIG. 1). In an embodiment, power is supplied from an external source, VCCX, which may have voltage levels from less than 1 V to higher than 3 V. As mentioned previously, embodiments of the invention may provide a stable VCCEQ at a voltage level that is higher than VCCX, and which is not affected by normal fluctuations in VCCX.

When power is initially supplied to the circuit, an oscillator signal produced by an oscillator (e.g., oscillator 206, FIG. 2) is used to drive a charge pump (e.g., charge pump 208). The charge pump produces a voltage at an output node (e.g., node 212) of the circuit. In an embodiment, the voltage at the output node is used as an equalizing voltage for complementary digit lines in a DRAM.

In block 404, a reference generator circuit (e.g., circuit 202) produces a reference voltage (e.g., at 216), which is approximately equal to and/or proportional to the output voltage of the charge pump, except that the reference generator circuit clamps the reference voltage at a maximum reference voltage level. In an embodiment, the maximum reference voltage level is less than a target output voltage (e.g., VCCEQ).

In block 406, a comparator (e.g., comparator 204) compares the reference voltage with a second voltage (e.g., at node 214), which represents a divided version of the voltage produced by the charge pump (e.g., at node 212). While the second voltage is sufficiently less than the reference voltage, as determined in block 408, the comparator produces an oscillator control output signal that causes the oscillator to be in an "on" state, in block 410. If the second voltage is substantially equal to or sufficiently greater than the reference voltage, the comparator produces an oscillator control output signal that causes the oscillator to be in an "off" state, in block 412. In another embodiment, the comparator does not cause the oscillator to turn off when the reference voltage and the second voltage are substantially equal, but waits until the second voltage is sufficiently greater than the reference voltage before turning the oscillator off.

The method then iterates as shown in FIG. 4, by continuously comparing the reference voltage and the second voltage, and producing an oscillator control signal accordingly. The method ends when power is removed from the circuit.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Figure 5:
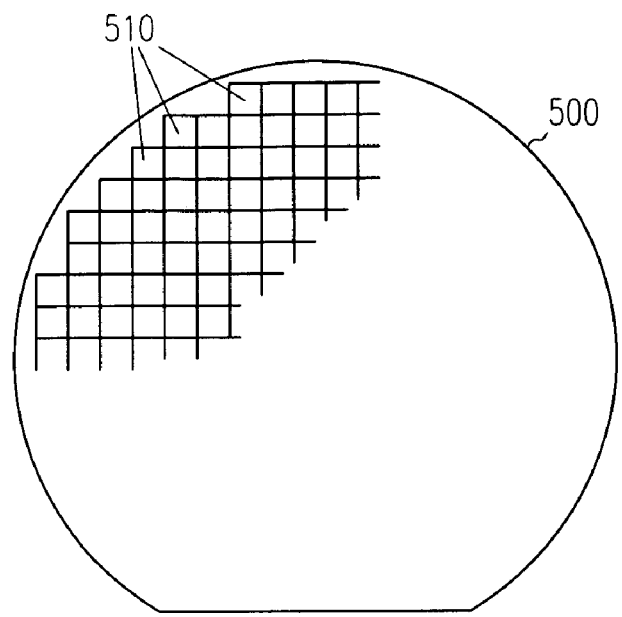
FIG. 5 is a top-down, elevational view of a wafer containing semiconductor dies in accordance with an embodiment.

FIG. 5 is a top-down, elevational view of a wafer 500 containing semiconductor dies 510 in accordance with an embodiment. A die is an individual pattern, typically rectangular, on a substrate that contains circuitry, or integrated circuit devices, to perform a specific function. At least one of the integrated circuit devices includes an equalizing voltage generator (e.g., VCCEQ generator 114, FIG. 1), embodiments of which are disclosed herein.

A semiconductor wafer will typically contain a repeated pattern of such dies containing the same functionality. Die 510 may contain circuitry for the inventive memory device, as discussed above. Die 510 may further contain additional circuitry to extend to such complex devices as a monolithic processor with multiple functionality. Die 510 is typically packaged in a protective casing (not shown) with leads extending therefrom (not shown) providing access to the circuitry of the die for unilateral or bilateral communication and control.

Figure 6:
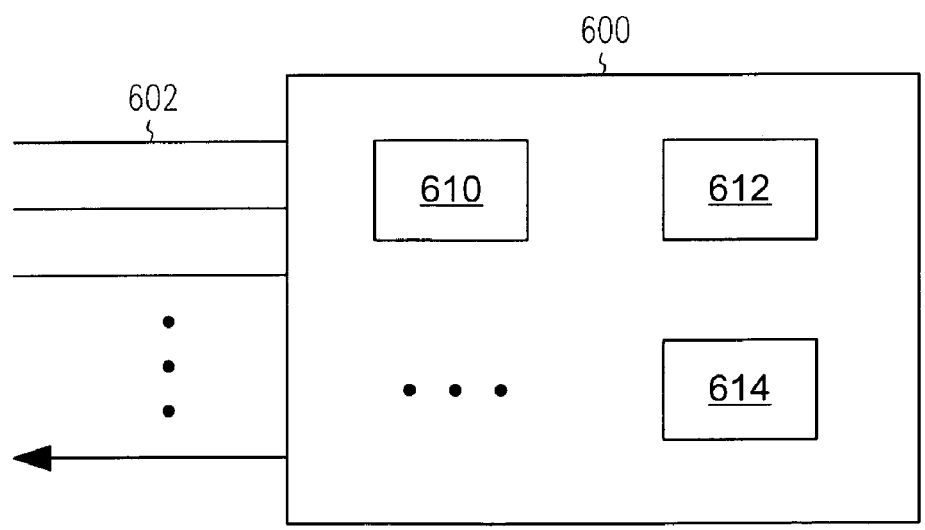
FIG. 6 is a simplified block diagram of an exemplary circuit module in accordance with an embodiment.

FIG. 6 is a simplified block diagram of an exemplary circuit module 600 in accordance with an embodiment. As shown in FIG. 6, two or more dies 610, 612, 614 (e.g., die 510, FIG. 5) may be combined, with or without protective casing, into circuit module 600 to enhance or extend the functionality of an individual die. Circuit module 600 may be a combination of dies representing a variety of functions, or a combination of dies containing the same functionality.

Some examples of a circuit module include memory modules, device drivers, power modules, communication modems, processor modules, and application-specific modules and may include multilayer, multichip modules. Circuit module 600 may be a subcomponent of a variety of electronic systems, such as a clock, a television, a cellular or radio communication device (e.g., cell phone, pager, etc.), a desktop, handheld or portable computer, an automobile, an industrial control system, an aircraft, an automated teller machine, and others. Circuit module 600 will have a variety of leads 602 extending therefrom and coupled to the dies 610, 612, 614 providing unilateral or bilateral communication and control.

Figure 7:
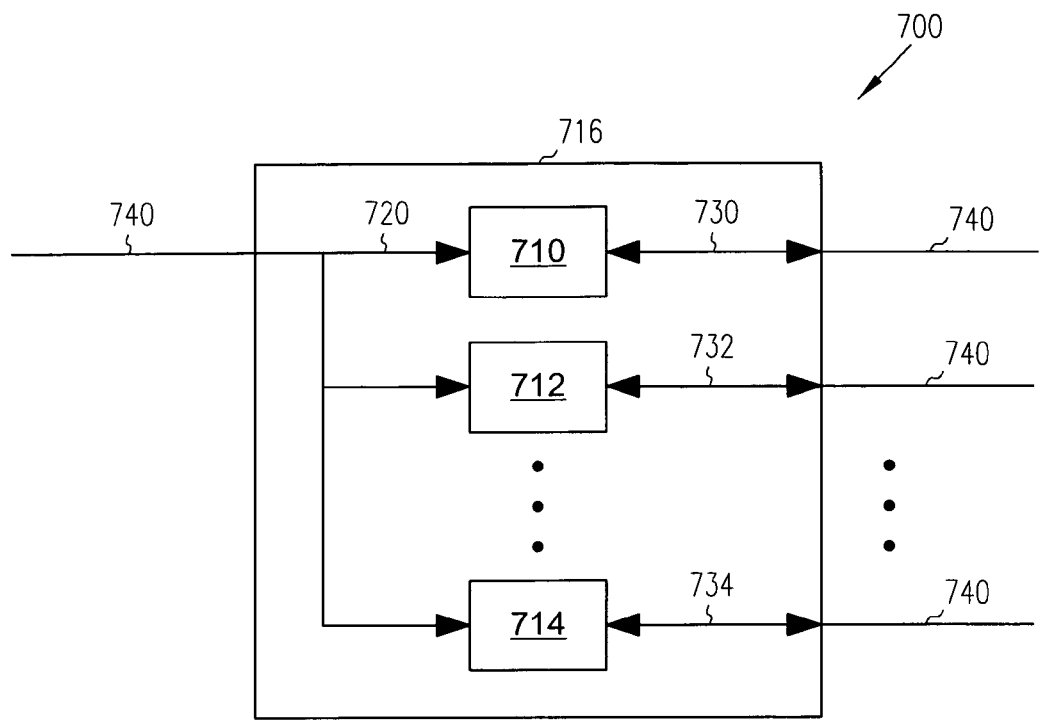
FIG. 7 is a simplified block diagram of an exemplary memory module in accordance with an embodiment.

FIG. 7 is a simplified block diagram of an exemplary memory module 700, which is an embodiment of a circuit module. Memory module 700 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals.

Memory module 700 contains multiple memory devices 710, 712, 714 (e.g., memory device 100, FIG. 1) contained on support 716, the number depending upon the desired bus width and the desire for parity. Memory module 700 may contain memory devices on both sides of support 716.

Memory module 700 accepts a command signal from an external controller (not shown) on a command link 720 and provides for data input and data output on data links 730, 732, 734. The command link 720 and data links 730, 732, 734 are connected to leads 740 extending from the support 716. Leads 740 are shown for conceptual purposes and are not limited to the positions shown in FIG. 7.

Figure 8:
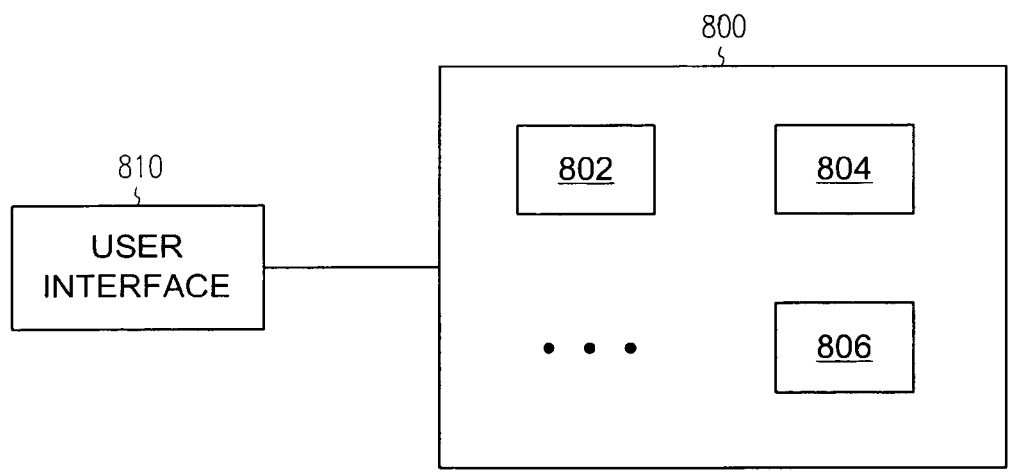
FIG. 8 is a simplified block diagram of an exemplary electronic system in accordance with an embodiment.

FIG. 8 is a simplified block diagram of an exemplary electronic system 800 containing one or more circuit modules 802, 804, 806 (e.g., circuit module 600, FIG. 6) in accordance with an embodiment. Electronic system 800 generally contains a user interface 810. User interface 810 provides a user of the electronic system 800 with some form of control or observation of the results of the electronic system 800. Some examples of user interface 810 include a keyboard, pointing device, monitor, and printer of a computer; a keypad, speaker, microphone, and display of a communication device; a tuning dial, display, and speakers of a radio; an ignition switch and gas pedal of an automobile; and a card reader, keypad, display, and currency dispenser of an automated teller machine, among other things. User interface 810 may further describe access ports provided to electronic system 800. Access ports are used to connect an electronic system to the more tangible user interface components previously exemplified.

One or more of the circuit modules 802, 804, 806 may include one or more memory devices, in accordance with various embodiments, and/or one or more processors providing some form of manipulation, control or direction of inputs from or outputs to user interface 810, or of other information either preprogrammed into, or otherwise provided to, electronic system 800. As will be apparent from the lists of examples previously given, electronic system 800 may contain certain mechanical components (not shown) in addition to circuit modules 1600 and user interface 810. It will be appreciated that the one or more circuit modules 802, 804, 806 in electronic system 800 can be replaced by a single integrated circuit. Furthermore, electronic system 800 may be a subcomponent of a larger electronic system.

Figure 9:
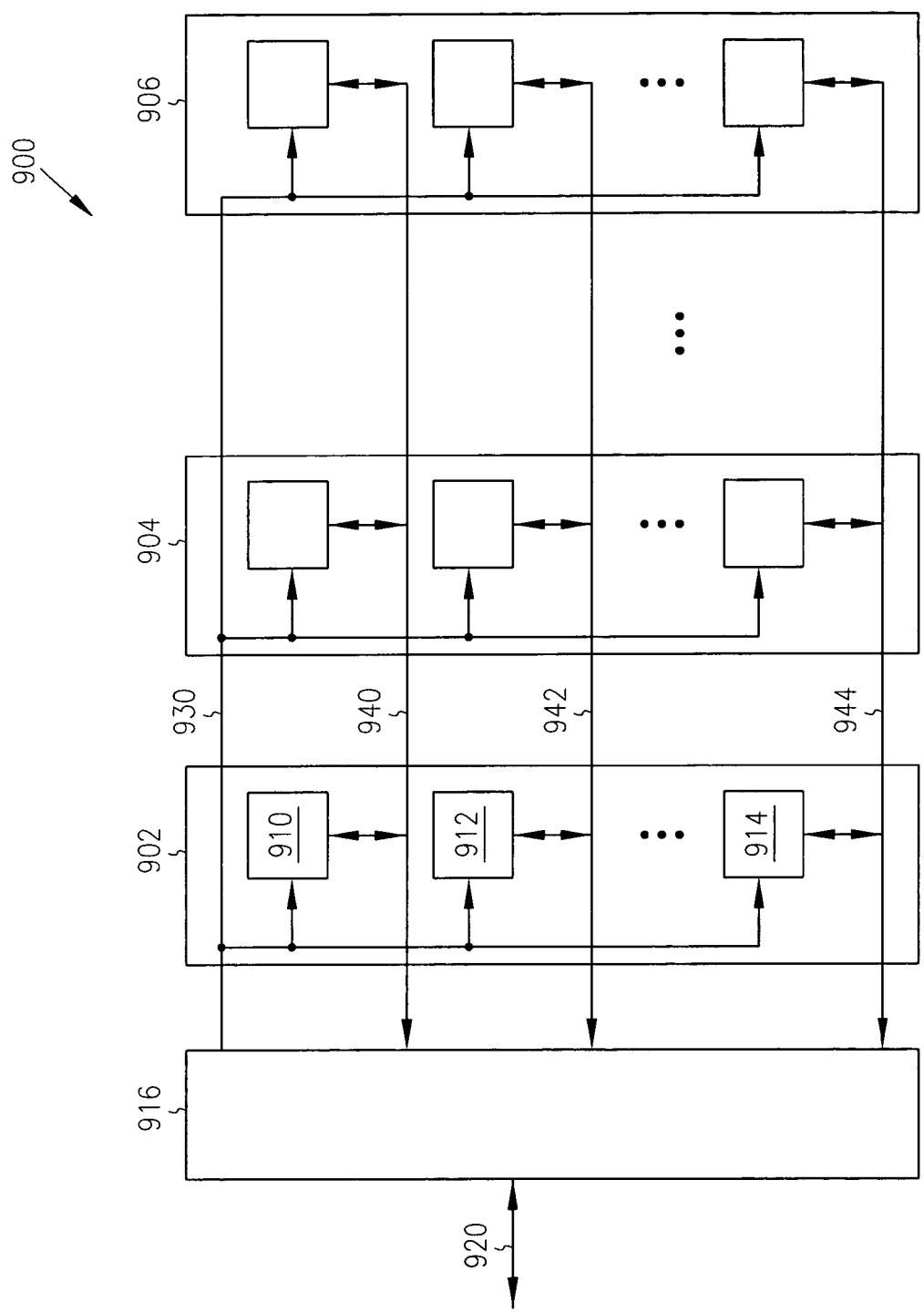
FIG. 9 is a simplified block diagram of an exemplary memory system in accordance with an embodiment.

FIG. 9 is a simplified block diagram of an exemplary memory system 900, which is an embodiment of an electronic system. Memory system 900 includes one or more memory modules 902, 904, 906 (e.g., module 700, FIG. 7) and a memory controller 916. Memory controller 916 provides and controls a bidirectional interface between memory system 900 and an external system bus 920. Memory system 900 accepts a command signal from the external bus 920 and relays it to the one or more memory modules 902, 904, 906 on a command link 930. Each memory module 902, 904, 906 may include one or more memory devices 910, 912, 914 (e.g., memory device 100, FIG. 1). Memory system 900 provides for data input and data output between the one or more memory modules 902, 904, 906 and external system bus 920 on data links 940, 942, 944.

Figure 10:
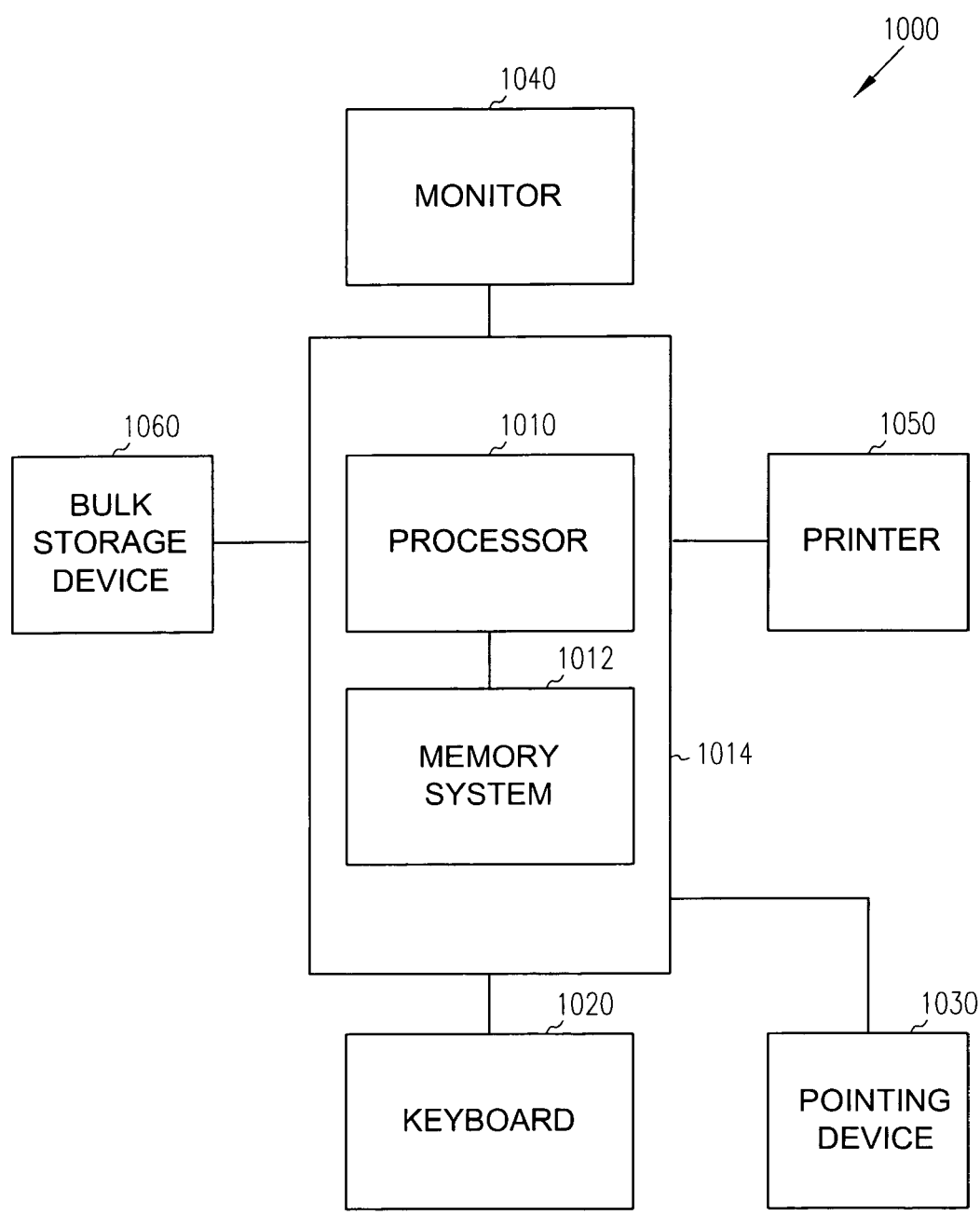
FIG. 10 is a simplified block diagram of an exemplary computer system in accordance with an embodiment.

FIG. 10 is a simplified block diagram of an exemplary computer system 1000, which is a further embodiment of an electronic system. Computer system 1000 includes one or more processors 1010 and one or more memory systems 1012 (e.g., system 900, FIG. 9) housed in a computer unit 1014. Computer system 1000 is but one example of an electronic system containing another electronic system (e.g., memory system 900) as a subcomponent. Computer system 1000 optionally includes or is coupled to various user interface components. Depicted in FIG. 10 are a keyboard 1020, a pointing device 1030, a monitor 1040, a printer 1050, and a bulk storage device 1060. It will be appreciated that other components may be associated with computer system 1000, such as modems, device driver cards, additional storage devices, etc. It will further be appreciated that the processor 1010 and memory system 1012 of computer system 1000 may be incorporated on a single integrated circuit.

In the foregoing description of the embodiments, reference is made to the accompanying drawings, which form a part hereof and show, by way of illustration, specific embodiments in which the inventive subject matter may be practiced. These embodiments are described in sufficient detail to enable those skilled in the art to practice the inventive subject matter.

Although specific embodiments have been illustrated and described herein, it will be appreciated by those of ordinary skill in the art that any arrangement that is calculated to achieve the same purpose may be substituted for the specific embodiments shown. It is to be understood that other embodiments may be utilized, and that process or mechanical changes may be made, without departing from the scope of the inventive subject matter. Many adaptations of the disclosed embodiments will be apparent to those of ordinary skill in the art, based on the description herein. Accordingly, this application is intended to cover adaptations or variations of the invention. It is manifestly intended that this invention be limited only by the following claims and equivalents thereof.

What is claimed is:

1. A circuit comprising:
an oscillator to receive an oscillator control signal and to produce an oscillator signal based on the oscillator control signal;
a charge pump, electrically coupled to the oscillator, to receive the oscillator signal and to produce a digit line equalization voltage at a first node, wherein the digit line equalization voltage is affected by the oscillator signal; and
a feedback and control circuit, electrically coupled to the first node, to produce an internal reference voltage, and to produce the oscillator control signal based on the internal reference voltage and the digit line equalization voltage.

2. The circuit of claim 1, wherein the feedback and control circuit comprises:
a reference generator circuit to produce the internal reference voltage.

3. The circuit of claim 2, wherein the reference generator circuit includes a band gap reference circuit, to receive the digit line equalization voltage and to clamp the internal reference voltage at a voltage level that is less than a target value for the digit line equalization voltage.

4. The circuit of claim 2, wherein the feedback and control circuit further comprises:
a comparator to make a comparison between the internal reference voltage and a second voltage that is affected by the digit line equalization voltage, and to produce the oscillator control signal based on the comparison.

5. The circuit of claim 4, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

6. The circuit of claim 4, wherein the feedback and control circuit further comprises:
a voltage divider circuit, to produce the second voltage as a fraction of the digit line equalization voltage.

7. An equalized supply voltage generating circuit of a memory device comprising:
an oscillator to receive an oscillator control signal and to produce an oscillator signal based on the oscillator control signal;
a charge pump, electrically coupled to the oscillator, to receive the oscillator signal and to produce a first voltage at a first node, wherein the first voltage is affected by the oscillator signal, and wherein the first voltage is usable as an equalized supply voltage for memory cells within a memory cell array; and
a feedback and control circuit, electrically coupled to the first node, to produce an internal reference voltage, and to produce the oscillator control signal based on the internal reference voltage and the first voltage.

8. The circuit of claim 7, wherein the feedback and control circuit comprises:
a reference generator circuit to produce the internal reference voltage;
a voltage divider circuit, to produce a second voltage as a fraction of the first voltage; and
a comparator to make a comparison between the internal reference voltage and the second voltage, and to produce the oscillator control signal based on the comparison.

9. The circuit of claim 8, wherein the reference generator circuit includes a band gap reference circuit, to receive the first voltage and to clamp the internal reference voltage at a voltage level that is less than a target value for the first voltage.

10. The circuit of claim 8, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

11. A memory device, comprising:
an array of memory cells; and
an equalized supply voltage generating circuit that includes:
an oscillator to receive an oscillator control signal and to produce an oscillator signal based on the oscillator control signal,
a charge pump, electrically coupled to the oscillator, to receive the oscillator signal and to produce a first voltage at a first node, wherein the first voltage is affected by the oscillator signal, and wherein the first voltage is usable as an equalized supply voltage for memory cells within the array of memory cells, and
a feedback and control circuit, electrically coupled to the first node, to produce an internal reference voltage, and to produce the oscillator control signal based on the internal reference voltage and the first voltage.

12. The memory device of claim 11, wherein the feedback and control circuit comprises:
a reference generator circuit to produce the internal reference voltage;
a voltage divider circuit, to produce a second voltage as a fraction of the first voltage; and
a comparator to make a comparison between the internal reference voltage and the second voltage, and to produce the oscillator control signal based on the comparison.

13. The memory device of claim 12, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

14. The memory device of claim 11, further comprising:
a row access circuit coupled to the array of memory cells;
a column access circuit coupled to the array of memory cells; and
an address decoder circuit coupled to the row access circuit and the column access circuit.

15. A dynamic random access memory device, comprising:
an array of memory cells;
a row access circuit coupled to the array of memory cells;
a column access circuit coupled to the array of memory cells;
an address decoder circuit coupled to the row access circuit and the column access circuit; and
an equalized supply voltage generating circuit, coupled to the array of memory cells, which includes:
an oscillator to receive an oscillator control signal and to produce an oscillator signal based on the oscillator control signal,
a charge pump, electrically coupled to the oscillator, to receive the oscillator signal and to produce a first voltage at a first node, wherein the first voltage is affected by the oscillator signal, and wherein the first voltage is usable as an equalized supply voltage for memory cells within the array of memory cells, and
a feedback and control circuit, electrically coupled to the first node, to produce an internal reference voltage, and to produce the oscillator control signal based on the internal reference voltage and the first voltage.

16. The dynamic random access memory device of claim 15, wherein the feedback and control circuit comprises:
a reference generator circuit to produce the internal reference voltage;
a voltage divider circuit, to produce a second voltage as a fraction of the first voltage; and
a comparator to make a comparison between the internal reference voltage and the second voltage, and to produce the oscillator control signal based on the comparison.

17. The dynamic random access memory device of claim 16, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

18. A semiconductor die, comprising:
a substrate; and
an integrated circuit supported by the substrate and having a plurality of integrated circuit devices, wherein selected ones of the integrated circuit devices include an equalized supply voltage generating circuit that includes:
   an oscillator to receive an oscillator control signal and to produce an oscillator signal based on the oscillator control signal,
   a charge pump, electrically coupled to the oscillator, to receive the oscillator signal and to produce a first voltage at a first node, wherein the first voltage is affected by the oscillator signal, and wherein the first voltage is usable as an equalized supply voltage for memory cells within the array of memory cells, and
   a feedback and control circuit, electrically coupled to the first node, to produce an internal reference voltage, and to produce the oscillator control signal based on the internal reference voltage and the first voltage.

19. The semiconductor die of claim 18, wherein the feedback and control circuit comprises:
   a reference generator circuit to produce the internal reference voltage;
   a voltage divider circuit, to produce a second voltage as a fraction of the first voltage; and
   a comparator to make a comparison between the internal reference voltage and the second voltage, and to produce the oscillator control signal based on the comparison.

20. The semiconductor die of claim 19, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

21. An integrated memory circuit, comprising:
a substrate; and
an integrated circuit supported by the substrate, wherein the integrated circuit includes an equalized supply voltage generating circuit that includes:
   an oscillator to receive an oscillator control signal and to produce an oscillator signal based on the oscillator control signal,
   a charge pump, electrically coupled to the oscillator, to receive the oscillator signal and to produce a first voltage at a first node, wherein the first voltage is affected by the oscillator signal, and wherein the first voltage is usable as an equalized supply voltage for memory cells within the array of memory cells, and
   a feedback and control circuit, electrically coupled to the first node, to produce an internal reference voltage, and to produce the oscillator control signal based on the internal reference voltage and the first voltage.

22. The integrated memory circuit of claim 21, wherein the feedback and control circuit comprises:
   a reference generator circuit to produce the internal reference voltage;
   a voltage divider circuit, to produce a second voltage as a fraction of the first voltage; and
   a comparator to make a comparison between the internal reference voltage and the second voltage, and to produce the oscillator control signal based on the comparison.

23. The integrated memory circuit of claim 22, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

24. An electronic system comprising:
a processor; and
an integrated memory circuit coupled to the processor, wherein the integrated memory circuit includes:
   an oscillator to receive an oscillator control signal and to produce an oscillator signal based on the oscillator control signal,
   a charge pump, electrically coupled to the oscillator, to receive the oscillator signal and to produce a first voltage at a first node, wherein the first voltage is affected by the oscillator signal, and wherein the first voltage is usable as an equalized supply voltage for memory cells within the array of memory cells, and
   a feedback and control circuit, electrically coupled to the first node, to produce an internal reference voltage, and to produce the oscillator control signal based on the internal reference voltage and the first voltage.

25. The electronic system of claim 24, wherein the feedback and control circuit comprises:
   a reference generator circuit to produce the internal reference voltage;
   a voltage divider circuit, to produce a second voltage as a fraction of the first voltage; and
   a comparator to make a comparison between the internal reference voltage and the second voltage, and to produce the oscillator control signal based on the comparison.

26. The electronic system of claim 25, wherein the comparator is to produce a first oscillator control signal that causes the oscillator to turn on when the second voltage is less than the internal reference voltage, and the comparator is to produce a second oscillator control signal that causes the oscillator to turn off when the second voltage approximately equals or is greater than the internal reference voltage.

27. A method for generating an equalized supply voltage for an array of memory cells, the method comprising:
   an oscillator receiving an oscillator control signal and producing an oscillator signal based on the oscillator control signal;
   a charge pump receiving the oscillator signal and producing a first voltage at a first node, wherein the first voltage is affected by the oscillator signal, and wherein the first voltage is usable as an equalized supply voltage for the array of memory cells; and
   a feedback and control circuit producing an internal reference voltage, and producing the oscillator control signal based on the internal reference voltage and the first voltage.

28. The method of claim 27, wherein producing the internal reference voltage comprises a reference generator circuit of the feedback and control circuit receiving the first voltage and clamping the internal reference voltage at a voltage level that is less than a target value for the first voltage.

29. The method of claim 27, wherein producing the oscillator control signal comprises:
produducing a second voltage as a fraction of the first voltage;
making a comparison between the internal reference voltage and the second voltage; and
producing the oscillator control signal based on the comparison.

30. The method of claim 29, wherein producing the oscillator control signal comprises:
producing a first oscillator control signal that causes the oscillator to turn on when the second voltage is less than the internal reference voltage; and
producing a second oscillator control signal that causes the oscillator to turn off when the second voltage approximately equals or is greater than the internal reference voltage.

31. The method of claim 27, further comprising equalizing complementary digit lines within the array of memory cells using the first voltage.

* * * * *